United States Patent [19]

Smith

[11] Patent Number: 4,686,705
[45] Date of Patent: Aug. 11, 1987

[54] SPECIAL VESTIGIAL SIDEBAND SIGNAL FOR USE IN COMMUNICATION SYSTEMS

[75] Inventor: Stephen F. Smith, Knoxville, Tenn.

[73] Assignee: Alpha-Omega Engineering, Inc., Knoxville, Tenn.

[21] Appl. No.: 931,428

[22] Filed: Nov. 17, 1986

Related U.S. Application Data

[63] Continuation of Ser. No. 574,388, Jan. 27, 1984, Pat. No. 4,660,222.

[51] Int. Cl.$^4$ .......................... H03C 1/52; H04B 1/68
[52] U.S. Cl. ...................................... 455/109; 455/47; 332/44
[58] Field of Search .......................... 455/109, 46, 47; 332/44, 45

[56] References Cited

U.S. PATENT DOCUMENTS 2,849,537  8/1958  Eglin ...................................... 455/47
3,229,232  1/1966  Sosin .................................... 455/109

OTHER PUBLICATIONS

Panter; *Modulation, Noise, and Spectral Analysis;* 1965; McGraw-Hill Inc.; New York; pp. 172-173.

Primary Examiner—Robert L. Griffin
Assistant Examiner—Andrew J. Telesz, Jr.
Attorney, Agent, or Firm—W. Thad Adams, III

[57] ABSTRACT

Several forms of a novel amplitude-modulated (AM) signal format are disclosed. Circuits of several types for generating the desired special vestigial-sideband (SVSB) AM waveforms are discussed. The principal form of the SVSB modulation provides for a reduction in transmitted signal bandwidth compared with standard double-sideband techniques plus very linear amplitude characteristics with simple synchronous detectors. Circuits according to the invention may also include means for dynamically varying signal bandwidth to accommodate special applications.

8 Claims, 19 Drawing Figures

Spectrum of SSB Signals (Prior Art)

Block Diagram of Preferred Embodiment

Fig. 1 Block Diagram of Standard DSB Modulator (Prior Art)

Fig. 2 Block Diagram of Standard SSB Generator, Filter Type (Prior Art)

Fig. 3 Block Diagram of Standard SSB Generator, Phasing Type (Prior Art)

Fig. 4 Spectrum of Standard DSB Signal (Prior Art)

Fig. 5 Spectrum of SSB Signals (Prior Art)

Fig. 6 Block Diagram of Preferred Embodiment

Fig. 7 Block Diagram of SVSB Generator, Equivalent Embodiment

Fig. 8 Block Diagram of SVSB Generator, Equivalent Embodiment

Fig. 9 Block Diagram of SVSB Generator, Alternate Embodiment

Fig. 10 Spectrum of SVSB Signal, Enhanced USB Case

Fig. 11 Spectrum of SVSB Signal, Enhanced LSB Case

Fig. 12 Spectrum of Proposed TV Aural Baseband Signal

Fig. 13 Block Diagram of Proposed TV Aural Baseband Signal Generator

Fig. 14 Spectrum of Proposed FM Baseband Signal

Fig. 15 Block Diagram of Proposed FM Baseband Signal Generator

Fig. 16 Spectrum of proposed Asymmetric AM Signal, Enhanced USB Case

Fig. 17 Block Diagram of Proposed Asymmetric AM Signal Generator, Linear Format

Fig. 18 Block Diagram of Proposed Asymmetric AM Signal Generator Phase Maker Format

SPECIAL VESTIGIAL SIDEBAND SIGNAL FOR USE IN COMMUNICATION SYSTEMS

This is a continuation of application Ser. No. 574,388 filed Jan. 27, 1984 now U.S. Pat. No. 4,660,222.

TECHNICAL FIELD AND BACKGROUND OF THE INVENTION

This invention relates to communication systems of all types which employ amplitude-modulated (AM) carrier or subcarrier signals to convey information signals (such as speech or music audio) from a transmitter to a receiver. Such applications generally transmit the aforementioned information on radio-frequency carriers via either conductors or through the atmosphere to the receiving devices, which in turn decode the information and convert it to a signal essentially identical with the original version. The principal application of the new signal format would most likely be in FM (and potentially TV aural) broadcasting, where an amplitude modulated subcarrier is employed to handle the stereo difference-channel modulation which with the main (sum-channel) signal is used to regenerate the original left- and right-channel audio material.

The invention described is a specific form of vestigial-sideband AM (VSB) wave which possesses amplitude and spectral properties basically intermediate to those of the classic double-sideband (DSB) and single-sideband (SSB) types. Specifically, the double-sideband signal occupies twice the bandwidth as the original modulating signal, since it incorporates two sidebands symmetrically about the center or carrier frequency; the SSB wave has only one sideband (either above or below the carrier) and exhibits a bandwidth equal to that of the modulating signal. The DSB signal has an amplitude envelope proportional to the magnitude of the modulating waveform, whereas the amplitude of the SSB signal envelope is in general greater than that of the modulation. The relationship between the SSB wave and the original modulation is complex and is dependent on the nature of the modulating waveform; the peak value of the SSB signal will actually approach infinity for a true square-wave modulating signal. For the complex bandlimited waveforms typical of speech and music audio, the SSB wave can easily be 6 to 12 dB higher in peak amplitude than the original signal (or the DSB form); this 6-12 dB factor would require the SSB transmitter to be capable of up to four times the output signal modulation amplitude of an equivalent system employing conventional DSB techniques. To avoid this difficulty, the standard practice is to employ DSB and simply accept the increased bandwidth requirement. In some applications, however, it would be highly desirable to reduce the bandwidth of the AM signal to a value substantially less than the DSB form while maintaining peak signal amplitudes near the DSB value.

The proposed "special" VSB signal (referred to as SVSB) is specifically configured to achieve these goals and to simultaneously permit low-distortion reception via the conventional synchronous detection techniques employed for DSB systems. Although vestigial sideband transmission has been employed for many years in U.S. television broadcasting to send the visual information, the SVSB signal, described herein is tailored to the needs of AM-based transmission and reception systems requiring a very high degree of accuracy in the demodulated signals, such as found in high-fidelity audio broadcasts.

SUMMARY OF THE INVENTION

Therefore it is an object of the invention to provide a signal with lesser bandwidth requirements than the conventional DSB form.

It is another object of the present invention to provide complete compatibility with existing widely deployed low-cost synchronous DSB signal detection hardware.

It is another object of the present invention to provide an output waveform having a peak amplitude very similar to that of a DSB modulator with the same input signal, so that excessive peak levels and resultant overmodulation are avoided.

It is another object of the present invention to provide modulator designs of roughly the same order of cost, complexity, and reliability as existing DSB units.

These and other objects and advantages of the present invention are achieved in the preferred embodiment of the method and apparatus below by providing a novel form of vestigial sideband AM modulator based on conventional "balanced-modulator" circuitry with specialized modulation signal conditioning to provide the desired SVSB output wave. The basic circuit is comprised of two balanced modulators, a quadrature carrier oscillator, a high-pass filter, a −90° all-pass phase shift network, and a summing amplifier. The first balanced-modulator multiplies the main input signal (assumed here to be a *bandlimited* audio signal) by the main (cosine) phase output from the quadrature carrier (or subcarrier) oscillator. This main RF output is a DSB signal of conventional form which is fed to one input of the summing amplifier; the other summing input is driven by the second balanced modulator unit. This circuit multiplies the lagging-phase (sine) output of the carrier-oscillator by a high-pass filtered, −90° phase shifted version of the input signal to produce a quadrature RF DSB signal which is either added to or substracted from the first DSB modulator output to produce the desired SVSB signal. The characteristics of the audio signal applied to the second (quadrature) modulator are selected to provide the desired properties of SVSB signal bandwidth and peak amplitude primarily via the cutoff frequency of the high-pass filter. Assuming a fairly sharp-cutoff filter response, the cut frequency is typically chosen to be one octave below the maximum audio frequency in the main input signal; for example, if the main signal has frequencies up to 15 kHz (typical of current broadcast practice) the highpass filter corner frequency would be set to approximately 7.5 kHz. The quadrature-leg balanced modulator is thereby only presented with frequencies between 7.5 kHz and 15 kHz, thus generating the quadrature-phase RF signal only for frequencies in the top octave of the audio range. There is essentially no quadrature RF signal produced for lower audio frequencies, which ensures that the system output is true DSB for frequencies below 7.5 kHz. The net result of these considerations is that the SVSB signal can be viewed as a hybrid AM system which has the form of a DSB signal for audio frequencies up to half the nominal bandwidth and of a SSB wave for audio components above 7.5 kHz.

The composite SVSB signal can therefore be accurately visualized as a standard DSB signal with the top half of one of the sidebands removed from one side of the carrier and translated or reflected to the opposite side. A conventional DSB-type synchronous detector will demodulate the SVSB wave precisely as if it were DSB, with very low distortion and flat frequency response over the audio passband. The effective bandwidth of this SVSB wave is three-fourths that of its DSB cousin and represents the arithmetic average of those of the SSB and DSB formats. The maximum amplitude of the SVSB envelope is identical to that of the DSB form for sinusoidal modulation for all audio frequencies of interest. In the top octave, the amplitude would tend to rise due to the SSB-like nature of the signal at these higher frequencies, but since the range is limited to a single octave (in practice, just under this range) there can be no harmonics of these frequencies in the output of the highpass filter and the resultant waveforms will be essentially sinusoidal. Since sinusoids produce no amplitude peaks in SSB modulator output waves greater than the input signals themselves, the desired amplitude constraint for the composite SVSB signal is also satisfied.

The third basic requirement for the new signal is met by several possible implementations, as described below. These various embodiments include two straightforward techniques for generating the wave, although there exist numerous others for generating the SVSB waveform described above, as well as several possible variants.

BRIEF DESCRIPTION OF THE DRAWINGS

Some of the objects of the invention have been set forth above. Other objects and advantages of the invention will appear as the description of the invention proceeds, when taken in conjunction with the following drawings, in which.

DESCRIPTION OF THE PREFERRED EMBODIMENT

Before proceeding to the description of various preferred embodiments of the invention, further note will be made of certain prior types of AM modulators which produce waveforms similar to those of the present device. An examination of the basic methods of operation of these earlier systems will aid greatly in the analysis of the present invention.

Figure 1:
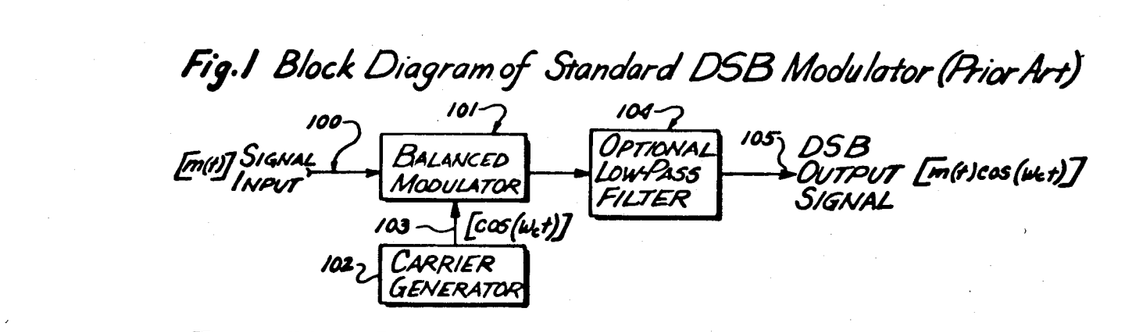
FIGS. 1, 2 and 3 provide basic block diagrams of standard prior art circuitry used to generate conventional DSB and SSB waveforms.

Referring first to FIG. 1, a general bandlimited analog input signal [designated "m(t)"] is introduced at 100 to be the modulation input of balanced modulator 101. The balanced modulator is a product device which effectively multiplies its two input signals together to produce the desired output. Some forms of 101 may produce additional spurious high-frequency signals; these can be removed by the optional low-pass filter 104. The carrier input of the balanced modulator 103 is fed from a single-frequency RF signal oscillator or generator 102 having an output mathematically described as:

$$\cos(w_c t),$$

where $w_c$ is the RF carrier frequency in radians/second. The resultant DSB output signal at 105 is the product of m(t) and the carrier wave:

$$DSB = m(t) \cdot \cos(w_c t).$$

Figure 4:
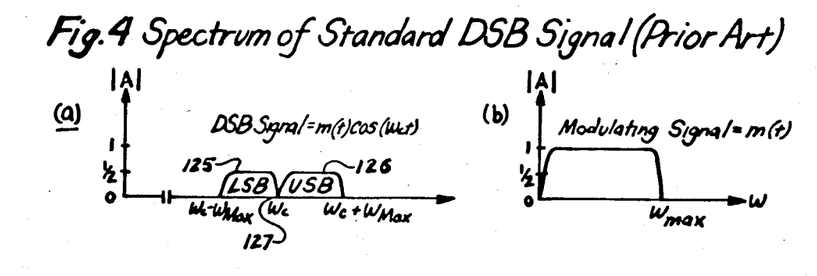
FIG. 4a is a graph of the relative amplitude spectrum of a standard DSB suppressed-carrier signal.
FIG. 4b is the spectrum of the general modulating signal m(t) used in most of the accompanying descriptions and figures.

This signal has the frequency spectrum indicated in FIG. 4a, where m(t) has the spectrum given by FIG. 4b.

Figure 2:
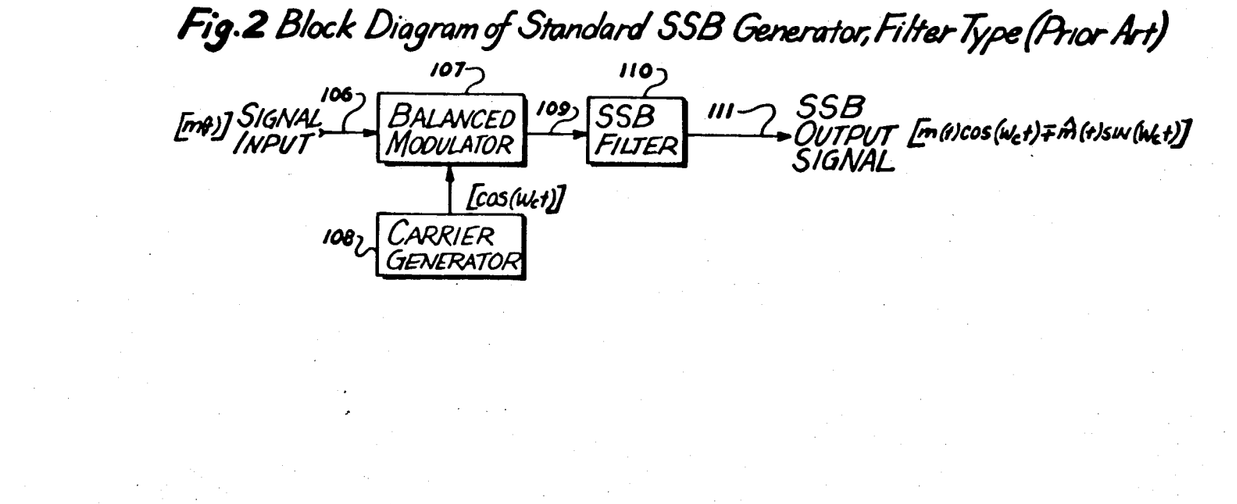
Figure 5:
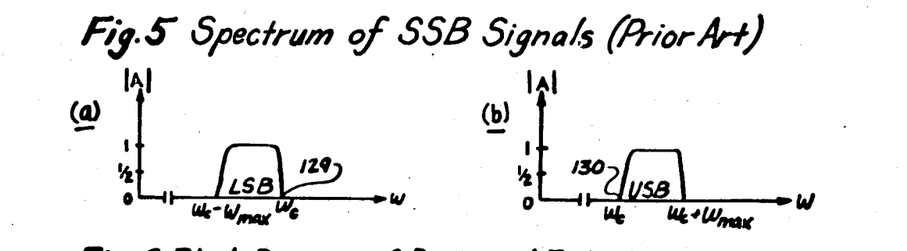
FIG. 5a shows the spectrum for a standard lower-sideband, suppressed-carrier SSB signal.
FIG. 5b shows the corresponding plot for an upper-sideband signal.

FIG. 2 is a block diagram of a filter-type SSB generation circuit, where the output of a circuit such as in FIG. 1 above (shown at point 109) is fed to the input of a special-purpose filter circuit at 110. This filter cuts off very sharply in amplitude near the carrier frequency $w_c$ and (according to its design) effectively removes either the upper sideband (USB) or lower sideband (LSB) of the DSB signal at 109. The resultant wave at 111 is a single-sideband signal whose nominal carrier frequency is at $w_c$. Depending upon which sideband is selected by 110, the spectrum will appear as in FIG. 5a or 5b.

Figure 3:
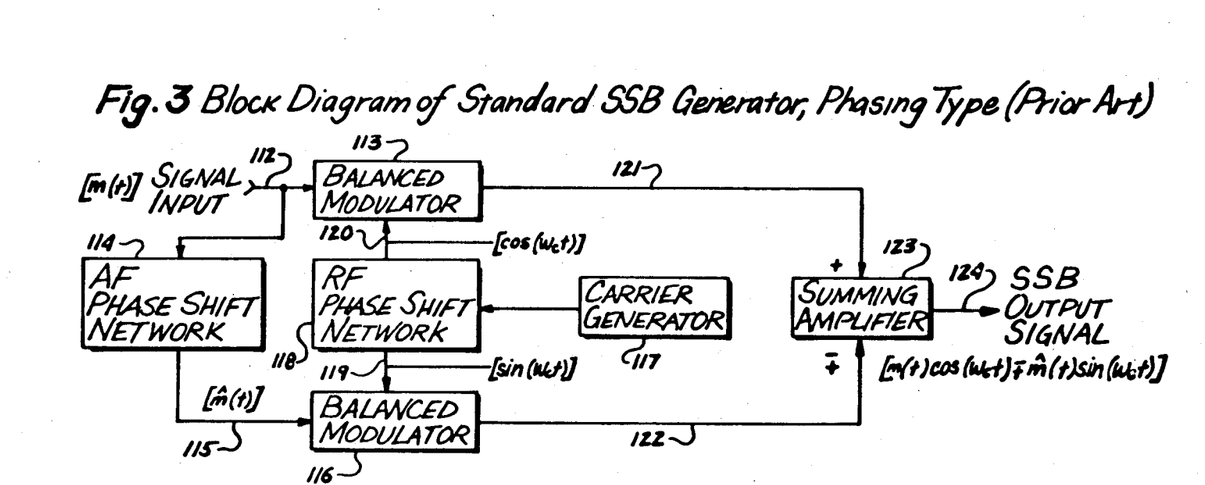

FIG. 3 illustrates the more elegant but also more complex form of SSB modulator generally referred to as the "phasing" type generator. The operation of this circuit is in principle very similar to the preferred embodiment of the present invention. First, the bandlimited input signal m(t) at 112 (typically audio) is applied to the modulation port of the balanced modulator 113 and to the input of the baseband phase-shift network 114. This network has the characteristic of a flat frequency-versus-amplitude response, but with a phase lag of 90° at all frequencies in the spectoral range of m(t). The resultant output signal at 115, designated (t), is mathematically the Hilbert transform of m(t); it can be visualized as simply a phase-shifted version of m(t). This signal at 115 is fed to the modulation input of a second balanced modulator 116. A carrier generator at 117 provides a stable single-frequency RF source which is applied to a quadrature RF phase shift network 118 which has two outputs separated by 90° in phase. The leading-phase output at 120 is of the form:

$$\cos(w_c t);$$

the lagging-phase signal at 119 can be described as:

sin ($w_c t$).

The carrier ports of the balanced modulators 113 and 116 are fed by the signals at 120 and 119 respectively, as shown in the diagram. The signals at 121 and 122 are given by:

$$V_{121} = m(t) \cos(w_c t);$$

and $$V_{122} = \hat{m}(t) \sin(w_c t).$$

These two signals are algebraically added in amplifier 123 to produce the desired SSB output wave at 124. For the USB case, $$V_{124}(USB) = m(t) \cos(w_c t) - \hat{m}(t) \sin(w_c t);$$

for the LSB case;

$$V_{124}(LSB) = m(t) \cos(w_c t) + \hat{m}(t) \sin(w_c t).$$

Figure 6:
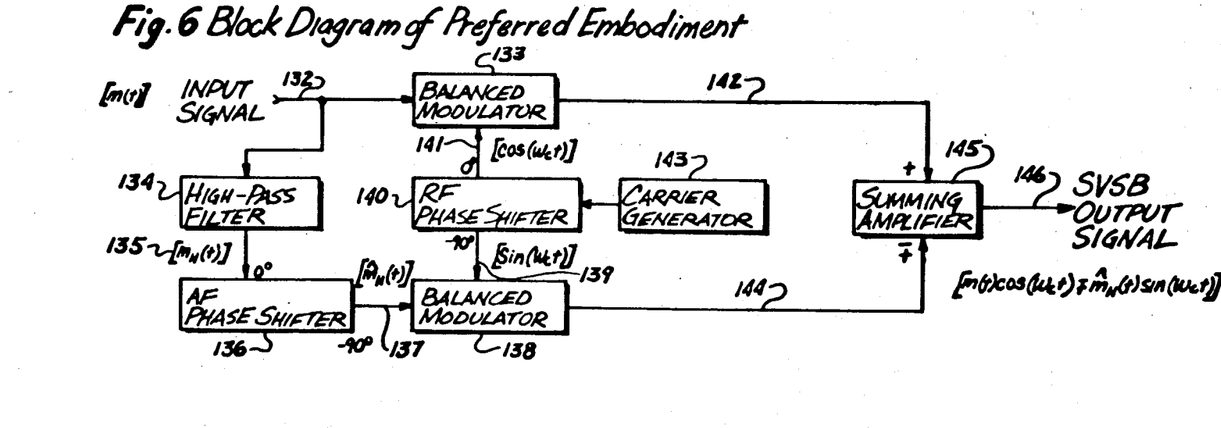
FIGS. 6 through 9 detail embodiments of the signal of the present invention, using both phasing and filtering techniques.

The signal of the present invention is most efficiently generated by the circuitry of FIG. 6; this is the preferred embodiment for the SVSB modulator. As before, the input signal m(t) [at 132 here] is applied to the modulation input of a balanced modulator 133. The input signal is also applied to a high-pass filter 134 which cuts off all frequencies in m(t) below $\tfrac{1}{2}w_{max}$ and thereby passes only the top octave of m(t); this high-pass version of the input is denoted $\hat{m}_H(t)$, as at 135. Now $m_H(t)$ is applied to the $-90°$ phase shift network 136, producing $_H(t)$ at 137. This phase-shifted, high-pass version of m(t) is then applied to the modulation input of balanced modulator 138, just as in the SSB case above. Again, a carrier source (143) feeds an RF phase-shift block (140) and produces quadrature carrier output at 141 and 139, with the form:

$$V_{141} = \cos(w_c t)$$

and $$V_{139} = \sin(w_c t).$$

Now the signals at 142 and 144 are given by:

$$V_{142} = m(t) \cos(w_c t),$$

and $$V_{144} = \hat{m}_H(t) \sin(w_c t).$$

Summing these two products in 145 yields the desired output signal:

$$V_{146} = m(t) \cos(w_c t) \pm m_H(t) \sin(w_c t),$$

where the connecting sign is $(-)$ for the enhanced USB case and $(+)$ for the enhanced LSB form of the SVSB signal.

Figures 7, 8:
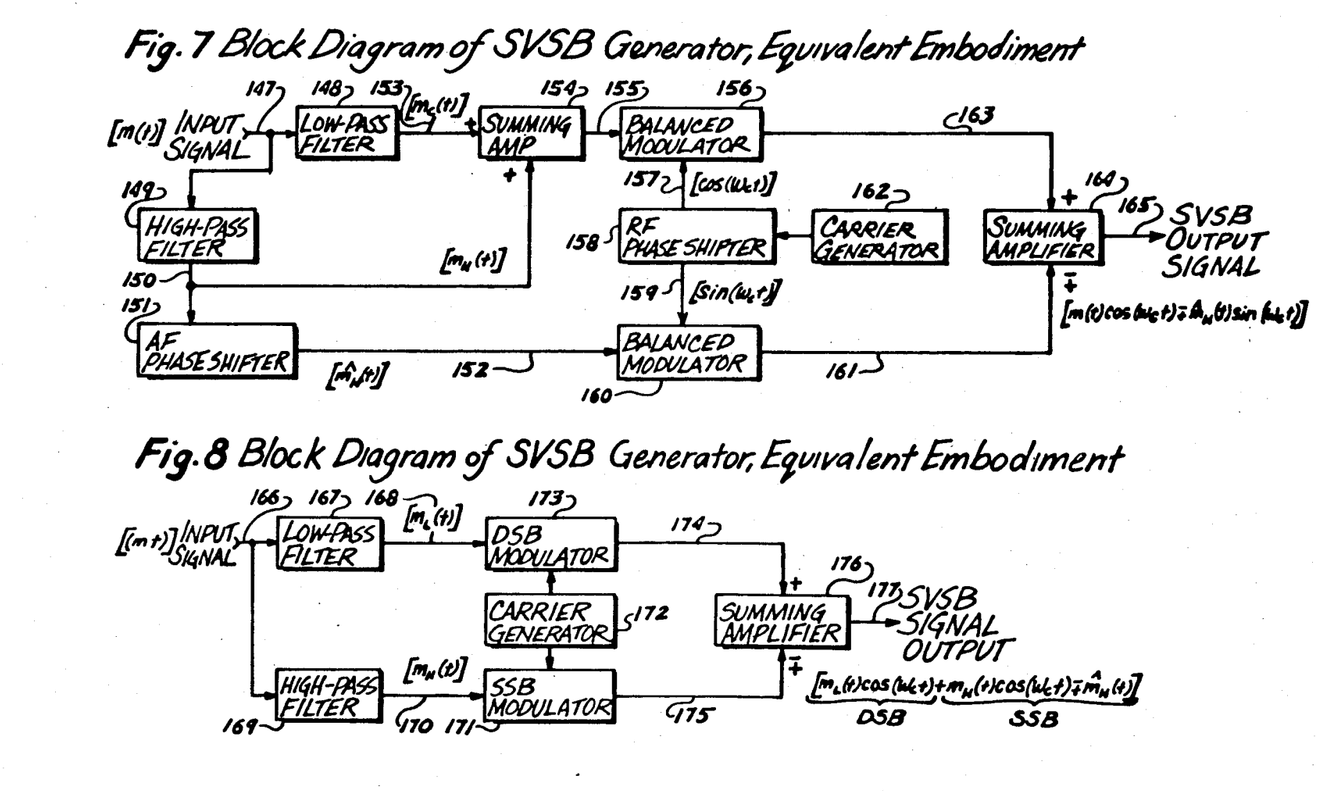

FIGS. 7 and 8 are included principally to aid in visualizing the SVSB wave; it is apparent from FIG. 7 that the output of the top modulator 156 includes components from the entire frequency range of m(t), whereas the output of the lower modulator 160 possesses sidebands due to only the top octave frequencies present in m(t). From FIG. 8 it becomes even more obvious that the SVSB wave is simply the sum of a DSB signal modulated by the lower frequencies ($\leq \tfrac{1}{2}W_{max}$) in m(t) and an SSB wave produced by the higher frequencies ($> \tfrac{1}{2}W_{max}$) in m(t). From the signals at 174 and 175, it can be seen that the SVSB output can be rewritten as:

$$V_{177} = \underbrace{\lfloor m_L(t) \cos(w_c t) \rfloor}_{DSB \text{ term}} + \underbrace{\lfloor m_H(t) \cos(w_c t) \pm \hat{m}_H(t) \sin(w_c t)}_{SSB \text{ term}}.$$

Observing that filters 167 and 169 are configured to have complementary responses, it is evident that:

$$m_L(t) + m_H(t) = m(t),$$

where $m_L(t)$ is the low-pass version (at 168) and $m_H(t)$ the high-pass version (at 170) of the original m(t). Substituting in the equation above for $V_{177}$, the form of $V_{146}$ is obtained:

$$V_{146} = V_{177} = [m_L(t) \cos(w_c t) + m_H(t) \cos(w_c t)] \pm \hat{m}_H(t) \sin(w_c t) = m(t) \cos(w_c t) \pm \hat{m}_H(t) \sin(w_c t).$$

Figure 9:
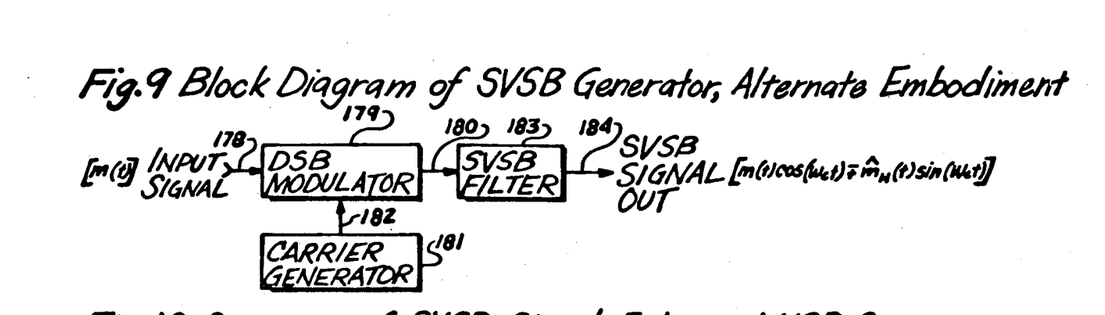

FIG. 9 depicts a filter-type SVSB implementation which is apparently simpler than the preferred embodiment; however, difficulties in synthesizing precisely the desired form of the SVSB filter of block 183 may render this form of SVSB modulator less attractive than the one of FIG. 6.

Figure 10:
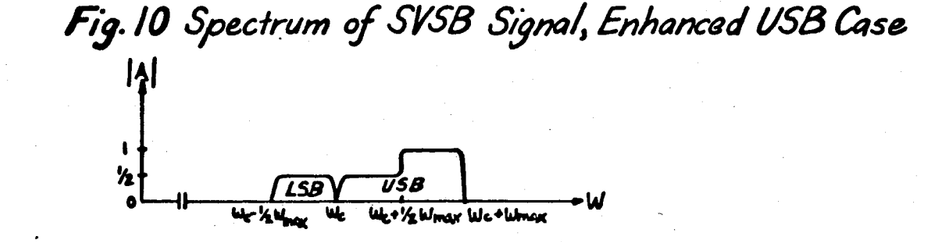
FIGS. 10 and 11 provide amplitude spectral plots for the two basic forms of the SVSB signal (with carrier suppressed)
Figure 11:
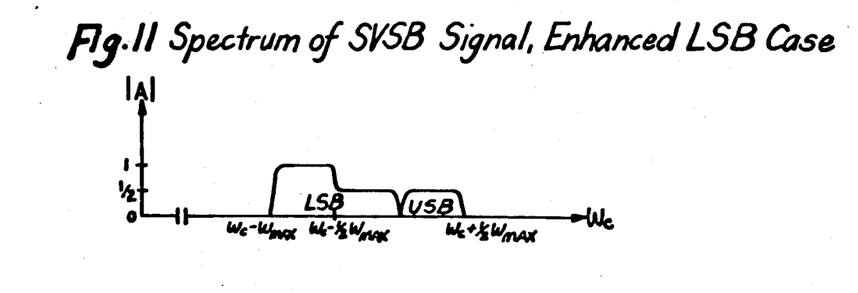
Figure 12:
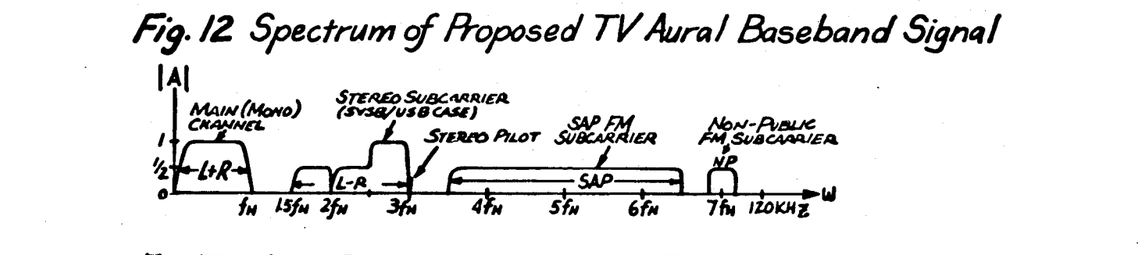
FIG. 12 gives the spectrum of a proposed TV aural baseband modulation format utilizing the SVSB wave.
Figure 13:
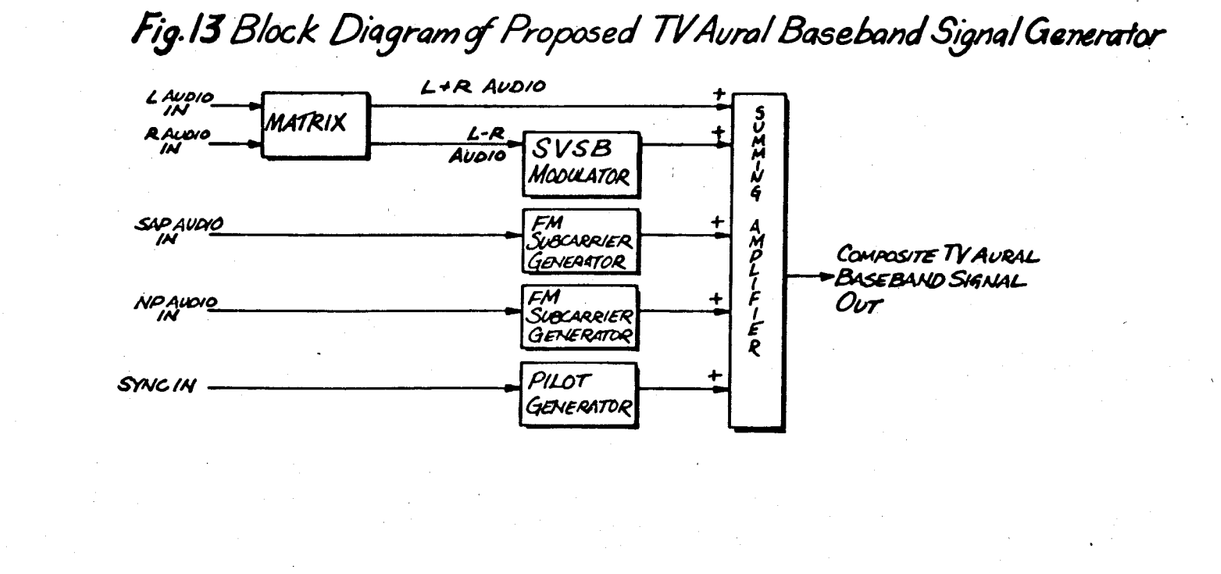
FIG. 13 provides the corresponding block diagram of a suggested implementation of the TV aural system.
Figure 14:
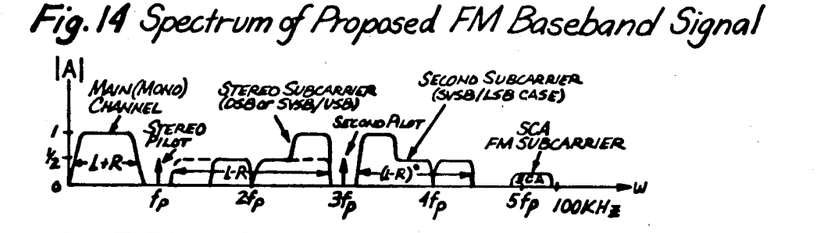
FIGS. 14 and 15 contain corresponding information for a proposed baseband modulation format designed to be used in standard FM radio broadcasting.
Figure 15:
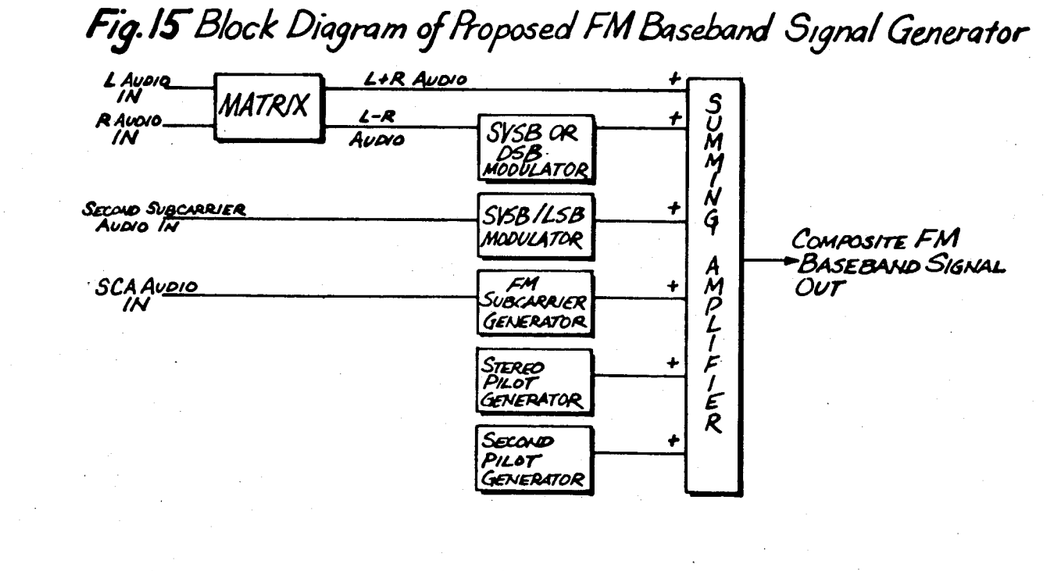
Figure 16:
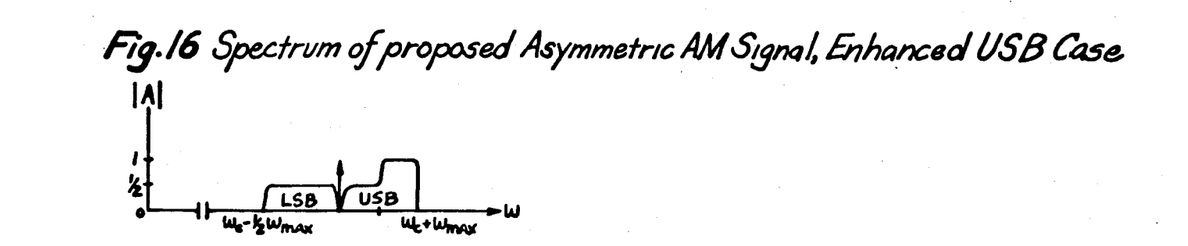
FIGS. 16 and 17 detail a corresponding application of the SVSB concept in standard AM broadcast and communication systems.
Figure 17:
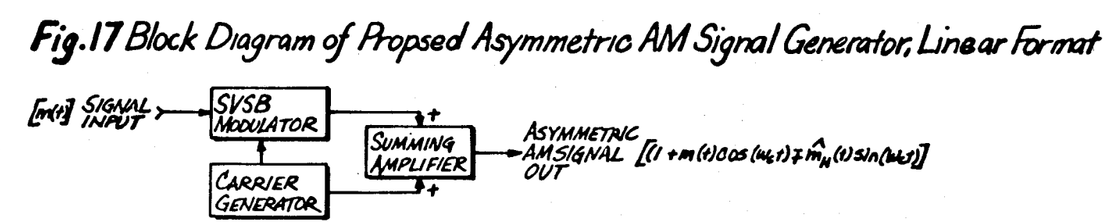
Figure 18:
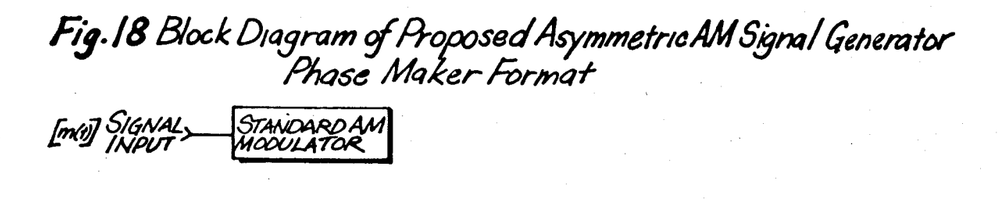
FIG. 18 is a block diagram of a proposed asymetric AM signal generator, phase-modulation format; and, FIG. 19 is a block diagram of a proposed variable-VSB generator, linear format.
Figure 19:
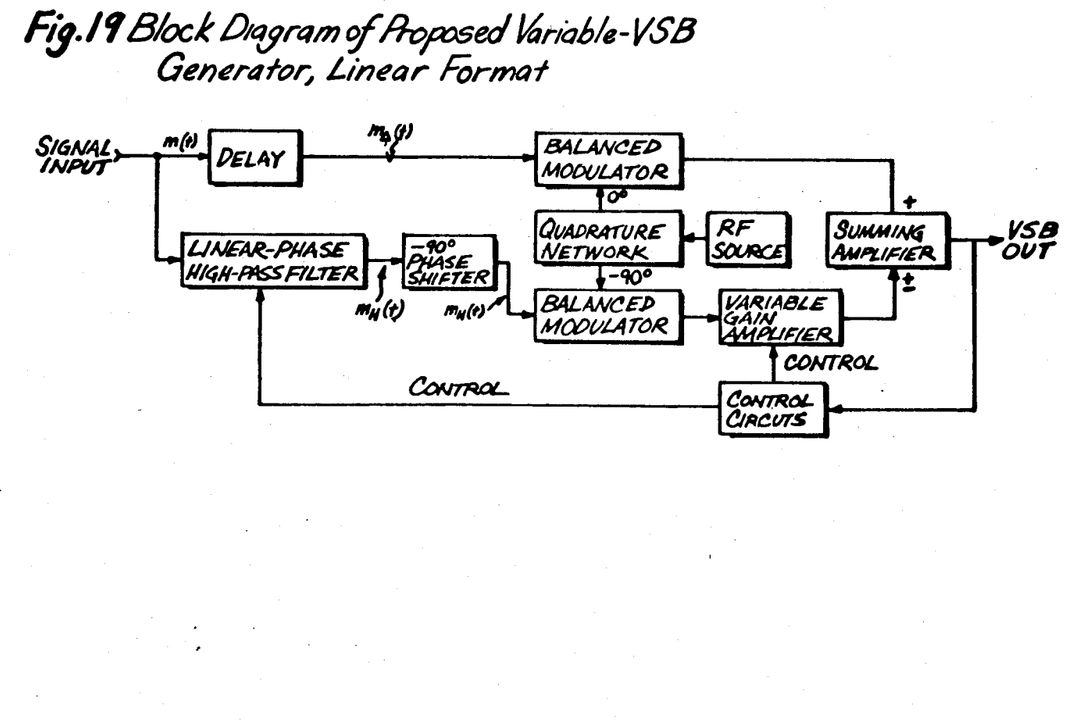

FIGS. 10 and 11 show graphs of the spectra of the two basic forms of SVSB signals and the relative amplitudes of each region of the spectra. From the mathematical form given in the previous equation, it can be verified that the SVSB signal may be accurately demodulated by a conventional synchronous detector (product detector) generally employed for DSB reception, where the demodulation is accomplished by multiplying a local in-phase carrier with the SVSB signal to get:

$$V_{DET} = \cos(w_c t) \cdot V_{SVSB} = \cos(w_c t) \cdot m(t) \cdot \cos(w_c t) \pm \hat{m}_H(t) \sin(w_c t)$$

$$V_{DET} = [\cos^2(w_c t)] \cdot m(t) \pm \hat{m}_H(t) \cos(w_c t) \sin(w_c t)$$

$$V_{DET} = \tfrac{1}{2} m(t) + \tfrac{1}{2} m(t) \cos(2 w_c t) \pm 0$$

$$V_{DET} = \tfrac{1}{2}[m(t) + m(t) \cos(2 w_c t)].$$

Now the term at $2w_c$ can be removed by a low-pass filter, leaving:

$$V_{DET} = \tfrac{1}{2} m(t),$$

which is exactly proportional to the original modulating signal. The efficient use of spectrum space of the SVSB signal (only $\tfrac{3}{4}$ of the DSB bandwidth) is used to advantage in the broadcast-oriented applications shown in FIGS. 12 through 18. The half-bandwidth vestigial sideband in each spectral plot is placed to permit guard bands at critical spots in the basebands of the TV and FM systems to enhance system performance and reduce crosstalk between the adjacent subcarrier channels. In the AM case of FIG. 16, the reduced-bandwidth signal could be employed on adjacent-channel stations to reduce sideband overlap: the station on the lower frequency would employ the enhanced-LSB form of SVSB modulation, while the higher-frequency station would use the enhanced-USB version.

A variable VSB signal can be synthesized using the techniques of FIG. 7; here, the high-pass filter cutoff frequency could be reduced to a value lower than the usual $\frac{1}{2}w_{max}$ when the waveform of m(t) is predominantly sinusoidal and thereby produce a greater proportion of SSB to DSB in the composite wave. When m(t) contains more high-frequency transient information, which would tend to produce excessive peak amplitudes in the SSB component, the filter cutoff will then be adjusted upward until the high peak amplitudes are brought into control.

Several embodiments of an apparatus and method for generating special vestigial sideband signal for use in communication systems are described above. Various details of the invention may be changed without departing from its scope. Furthermore, the foregoing description of several preferred embodiments of the apparatus and method according to the present invention is provided for the purpose of illustration only and not for the purpose of limitation—the invention being defined by the claims.

I claim:

1. A circuit for generating a vestigial-sideband waveform having enhanced bandwidth and amplitude characteristics and comprising:
   (a) a first signal source for generating a baseband signal which may include a d.c. component;
   (b) a second signal source for generating a carrier signal;
   (c) a signal modulating or multiplying device for receiving the baseband signal from the first source and the carrier signal from the second source and electronically multiplying the carrier signal by the baseband signal to produce a double-sideband AM signal with an appropriate carrier component or suppressed carrier, depending on the presence of a d.c. component in the baseband signal;
   (d) signal converting means for accepting the double-sideband AM signal, with or without a carrier component, and processing it to produce a vestigial-sideband output signal, having an instantaneous bandwidth intermediate to that of a corresponding double-sideband signal which would be produced by said baseband signal and that of a corresponding single-sideband signal which would be produced by said baseband signal, which vestigial-sideband output signal can be detected without distortion by conventional double-sideband receiving equipment employing synchronous or "product" detectors as if the vestigial-sideband signal were a conventional double-sideband signal with an appropriate carrier component, and which possesses no amplitude peaks substantially in excess of those of the corresponding double-sideband signal regardless of the original baseband modulating signal, said signal converting means comprising a specialized vestigial-sideband filter whose amplitude characteristic versus frequency possesses complementary symmetry about the carrier frequency of the second source and whose phase response is approximately linear and antisymmetric about that frequency.

2. The circuit as claimed in claim 1, wherein the signal converting means comprises a third source for generating a carrier signal in phase quadrature to said second signal source carrier output, a linear phase high-pass filter whose cutoff frequency determines the bandwidth of the vestigial-sideband output signal and which receives the output of the first signal source, a compensating delay filter inserted between the first signal source and the first modulating device, a 90 degree phase-shift network which receives the output signal from said high-pass filter, a second signal modulating or multiplying device which receives the inputs from said phase shifter and from said third signal source, and a summing amplifier which receives the outputs from the first and second modulating devices and adds them algebraically to generate the desired form of the vestigial-sideband signal.

3. The circuit as claimed in claim 2, wherein the cutoff frequency of said high-pass filter is variable according to parameters of the original modulating signal from said first source to effect control of the bandwidth of the vestigial-sideband output signal to prevent excessive peak amplitudes in the same output signal, as determined by the application criteria.

4. The circuit as claimed in claim 3 and including an amplifier inserted between the output of said second modulating device and the corresponding input of said summing amplifier the gain of which amplifier may be varied according to parameters of the original modulating signal from said first signal source to effect control of the bandwidth of the vestigial-sideband output signal so as to prevent excessive peak amplitudes in the same output signal, as determined by the application criteria.

5. A method for generating a vestigial-sideband waveform having enhanced bandwidth and amplitude characteristics and comprising:
   (a) generating from a first signal source a baseband signal which may include a d.c. component;
   (b) generating from a second signal source a carrier signal;
   (c) receiving the baseband signal from the first source and the carrier signal from the second source and electronically multiplying the carrier signal by the baseband signal to produce a double-sideband AM signal with an appropriate carrier component or suppressed carrier, depending on the presence of a d.c. component in the baseband signal;
   (d) converting the double-sideband AM signal, with or without a carrier component, and processing it to produce a vestigial-sideband output signal, said vestigial-sideband output signal having an instantaneous bandwidth intermediate to that of a corresponding double-sideband signal which would be produced by the same baseband signal and that of a corresponding single-sideband signal which would be produced by the same baseband signal, which can be detected without distortion by conventional double-sideband receiving equipment employing synchronous or product detectors as if the vestigial-sideband signal were a conventional double-sideband signal with an appropriate carrier component, and which possesses no amplitude peaks substantially in excess of those of the corresponding double-sideband signal regardless of the original baseband modulating signal; and
   (e) varying the cutoff frequency of said high-pass filter according to parameters of the original modulating signal from said first source to effect control of the bandwidth of the vestigial-sideband output signal to prevent excessive peak amplitudes in the same output signal, as determined by the application criteria.

6. The method as claimed in claim 5, wherein the double-sideband AM signal is converted by a specialized vestigial-sideband filter whose amplitude characteristic versus frequency possesses complementary symmetry about the carrier frequency possesses complementary symmetry about the carrier frequency of the second source and whose phase response is approximately linear and antisymmetric about that frequency.

7. The method as claimed in claim 6, wherein the step of converting the double-sideband AM signal comprises the steps of providing a third source for generating a carrier signal in phase quadrature to said second signal source carrier output; providing a linear phase high-pass filter whose cutoff frequency determines the bandwidth of the vestigial-sideband output signal and which receives the output of the first signal source; inserting a compensating delay filter between the first signal source and the first modulating device; receiving the output signal from said high-pass filter by means of a 90 degree phase shift network; receiving the inputs from said phase shifter and from said third signal source in a second signal modulating or multiplying device; and receiving the outputs from the first and second modulating devices and summing them algebraically to generate the desired form of the vestigial-sideband signal.

8. The method as claimed in claim 7, and including the step of inserting between the output of said second modulating device and the corresponding input of said summing amplifier an amplifier, and varying the gain thereof according to parameters of the original modulating signal from said first signal source to effect control of the bandwidth of the vestigial-sideband output signal to prevent excessive peak amplitudes in the same output signal, as determined by the application criteria.

* * * * *

UNITED STATES PATENT AND TRADEMARK OFFICE
CERTIFICATE OF CORRECTION

PATENT NO. : 4,686,705

DATED : August 11, 1987

INVENTOR(S) : Stephen F. Smith

It is certified that error appears in the above-identified patent and that said Letters Patent is hereby corrected as shown below:

Column 9, line 2, delete "possesses complementary symmetry about the carrier frequency" which has been duplicated.

Column 5, line 33, delete "$\hat{\overline{m}}_H(t)$" and insert --$\overline{m}_H(t)$--.

Column 5, line 34, delete "$_H(t)$" and insert --$\hat{m}_H(t)$--.

UNITED STATES PATENT AND TRADEMARK OFFICE
CERTIFICATE OF CORRECTION

PATENT NO. : 4,686,705

DATED : August 11, 1987

INVENTOR(S) : Stephen F. Smith

It is certified that error appears in the above-identified patent and that said Letters Patent is hereby corrected as shown below:

Column 5, line 57, delete the following:

$$V_{146} = m(t) \cos(w_c t) \pm m_H(t) \sin(w_c t),$$

and insert:

$$V_{146} = m(t) \cos(w_c t) \pm \hat{m}_H(t) \sin(w_c t),$$

Signed and Sealed this

Eighteenth Day of October, 1988

*Attest:*

DONALD J. QUIGG

*Attesting Officer*    *Commissioner of Patents and Trademarks*